United States Patent [19]

Bass, Jr. et al.

[11] Patent Number: 4,870,470
[45] Date of Patent: Sep. 26, 1989

[54] NON-VOLATILE MEMORY CELL HAVING SI RICH SILICON NITRIDE CHARGE TRAPPING LAYER

[75] Inventors: Roy S. Bass, Jr., Underhill; Arup Bhattacharyya, Essex Junction; Gary D. Grise, Colchester, all of Vt.

[73] Assignee: International Business Machines Corporation, Armonk, N.Y.

[21] Appl. No.: 108,886

[22] Filed: Oct. 16, 1987

[51] Int. Cl.[4] .................... H01L 29/78; H01L 27/10; H01L 29/34

[52] U.S. Cl. ............... 357/23.5; 357/23.15; 357/45; 357/54

[58] Field of Search ............ 357/23.5, 23.15, 54, 357/49, 45

[56] References Cited

U.S. PATENT DOCUMENTS

| | | | |
|---|---|---|---|
| 3,500,142 | 3/1970 | Kahng | 317/235 |
| 3,573,096 | 3/1971 | Tombs | 437/241 |
| 3,649,884 | 3/1972 | Haneta | 317/235 |
| 3,878,549 | 4/1975 | Yamazaki et al. | 357/23 |
| 3,979,613 | 9/1976 | Kroger et al. | 357/52 |
| 4,104,675 | 9/1978 | DiMaria et al. | 357/54 |
| 4,238,278 | 12/1980 | Antipov | 357/49 |
| 4,462,090 | 7/1984 | Iizuka | 357/54 |
| 4,519,051 | 5/1985 | Fuji | 357/23.5 |
| 4,601,779 | 7/1986 | Abernathey | 156/628 |
| 4,654,828 | 3/1987 | Hagiwara et al. | 357/54 |
| 4,688,078 | 4/1987 | Hseih | 357/54 |

FOREIGN PATENT DOCUMENTS

| | | | |
|---|---|---|---|
| 55-87490A | 7/1980 | Japan . | |
| 59-63764 | 4/1984 | Japan | 357/23.5 |
| 60-67679 | 4/1985 | Japan . | |
| 62-14474 | 1/1987 | Japan | 357/23.5 |
| 8100790 | 3/1981 | PCT Int'l Appl. . | |

OTHER PUBLICATIONS

J. P. Kasold et al., U.S. application Ser. No. 869,469, filed May 28, 1986.
W. Kern et al., "Advances in Deposition Processes for Passivation Films" *Journal of Vacuum Science & Technology*, vol. 14, No. 5 (Sep./Oct. 1987), pp. 1082-1099.
D. J. DiMaria et al., "Electrically-Alterable Read-Only-Memory Using Si-Rich SiO$_2$ Injectors and a Floating Polycrystalline Silicon Storage Layer," *J. Appl. Phys.*, 52(7), Jul. 1981, pp. 4825-4842.
R. A. Gdula, "The Effects of Processing on Hot Electron Trapping in SiO$_2$," *J. Electrochem. Soc.: Solid-State Science and Tech.*, Jan. 1976, pp. 42-47.
D. R. Young, "Electron Trapping in SiO$_2$," Inst. Phys. Conf. Ser. No. 50: Chapter 1, pp. 28-39.
D. J. DiMaria et al., "Charge Transport and Trapping Phenomena in Off-Stoichiometric Silicon Dioxide Films," *J. Appl. Phys.* 54(10), Oct. 1983, pp. 5801-5927.
D. J. DiMaria et al., "High Current Injection into SiO$_2$ from Si Rich SiO$_2$ Films and Exprimental Applications," *J. Appl. Phys.* 51(5), May 1980, pp. 2722-2735.
A. Bhattacharyya et al., "Physical and Electrical Characteristics of LPCVD Si-Rich-Nitride," The Electrochemical Society, Inc., Oct. 1984.
K. Tanabashi et al., "Properties of Vapor Deposited Silicon Nitride Films with Varying Excess Si Content," *Japanese Journal of Applied Physics*, vol. 12, No. 5, May 1973, pp. 641-646.
D. J. DiMaria et al., "Charge Trapping Studies in SiO$_2$ Using High Current Injection from Si-Rich SiO$_2$ Films," *J. Appl. Phys.* 51(9), Sep. 1980, pp. 4830-4841.
L. A. Nesbit, "Annealing Characteristics of Si-Rich SiO$_2$ Films," *Appl. Phys. Lett.* 46(1), Jan. 1985, pp. 38-40.

*Primary Examiner*—J. Carroll
*Attorney, Agent, or Firm*—Mark F. Chadurjian

[57] ABSTRACT

A non-volatile storage cell comprising a field effect transistor having source, gate, and drain electrodes. The gate electrode includes a gate stack having a dielectric layer, a charge storage structure comprising a layer of silicon-rich silicon nitride having sufficient excess silicon to provide appreciable charge storage enhancement, without providing appreciable charge conductance enhancement, as compared to stoichiometric silicon nitride, and a charge injection means. A control electrode is disposed on the gate stack for effecting charge transfer to and from the silicon-rich silicon nitride layer through the charge injection means. An array of these cells is formed by disposing the FETs within independently biased substrate portions. Thus the cells can be overwritten without an intervening erasure cycle.

24 Claims, 8 Drawing Sheets

NON-VOLATILE MEMORY CELL HAVING SI RICH SILICON NITRIDE CHARGE TRAPPING LAYER

TECHNICAL FIELD

The present invention relates generally to integrated circuit memory cells, and more particularly to non-volatile, programmable memory cells.

CROSS-REFERENCE TO RELATED APPLICATIONS

Reference is made to co-pending U.S. patent application Ser. No. 869,469, entitled "Dual Gate EEPROM Cell," filed May 28, 1986, continuation of U.S. patent application Ser. No. 655,175, filed Sept. 27, 1984, now abandoned. The invention relates to an EEPROM cell wherein first and second dual electron injector structure (DEIS) control gates overlay a single polysilicon floating gate, and are coupled to separate control voltages so as to write to and read from the cell without an intervening erase cycle.

BACKGROUND ART

Electrically erasable programmable read only memories (EEPROM) have gained widespread acceptance in the industry. EEPROM cells do not require the periodic refresh pulses needed by the capacitive storage elements of conventional one-device dynamic random access memory (DRAM) cells. This presents an appreciable power savings. Because they rely upon charge injection/removal to establish the stored logic state, the write cycles of EEPROM cells are appreciably longer than those of DRAM's.

Several exemplary EEPROM technologies will now be discussed.

U.S. Pat. No. 3,500,142 (issued Mar. 10, 1972, to Kahng and assigned to AT&T) describes a programmable field effect transistor (FET) wherein the gate electrode is defined by a layer of silicon oxide disposed over a portion of the silicon substrate between two P-type diffusion regions, a layer of zirconium on the oxide layer, a layer of zirconium oxide on the zirconium layer, and a control electrode on the zirconium oxide layer. The zirconium layer serves as a "floating gate" structure. That is, the zirconium layer is not directly coupled to a source of applied potential. Rather, it is allowed to assume its own voltage state (i.e., "float") as a function of the capacitive coupling between it and the overlying control electrode. To program the cell, a high bias is applied to the control electrode. The capacitive coupling between the control electrode and the floating gate is such that a channel region is induced in the underlying portion of the silicon substrate between the two P-type diffusion regions. At this high bias potential, some carriers will have sufficient energy to be injected through the silicon oxide layer into the floating gate. This injection of carriers (by avalanche breakdown or by hot electron effects) will provide an amount of charge to the floating gate that is determined by the applied bias. To erase the cell, a negative bias is supplied to the control electrode such that the charge carriers previously accumulated in the floating gate are injected through the oxide layer into the silicon substrate.

In other EEPROM cells, a non-conductive charge trapping layer is used in place of the above zirconium floating gate. In U.S. Pat. No. 3,878,549 (issued Apr. 15, 1975, to Yamazaki et al) the FET gate electrode is comprised of a layer of silicon oxide contacting the silicon substrate, a thin layer of silicon nitride over the silicon oxide, a plurality of silicon clusters disposed on the nitride layer, a second layer of silicon nitride overlying the silicon clusters, and a control electrode. At high applied bias, electrons will be injected through the silicon oxide layer and the first silicon nitride layer, where they will be trapped by the silicon clusters overlying the silicon nitride layer. In Japanese Published Patent Application No. J55-87490-A (filed Dec. 25, 1978 by Endou and assigned to Toshiba), a plurality of interposed silicon oxide and silicon nitride layers are provided. Charge injected from the substrate is trapped by one or more of the silicon nitride films depending on the magnitude of the applied bias. PCT Application No. 80-01179 (filed Sept. 13, 1979, by Trudel et al and assigned to NCR) discloses a non-volatile memory cell in which charge injected from the silicon substrate passes through a silicon oxide layer where it is trapped by a layer of silicon nitride. U.S. Pat. No. 3,649,884 (issued Mar. 14, 1972, to Haneta and assigned to NEC) discloses a field effect transistor with a gate assembly that includes an intervening layer of silicon rich silicon oxide that traps charge injected from the silicon substrate through an intervening layer of stoichiometric silicon oxide.

In the references discussed above, the memory cell is programmed by charge injection from the induced channel region of the substrate, through an intervening insulating layer, into a conductive or non-conductive charge trapping layer. In practice, it is difficult to precisely control the extent of charge injection from the induced channel region. The silicon oxide layer separating the channel region from the overlying charge trapping layer must be thin enough to allow charge transfer and yet thick enough to allow the charge trapping layer to retain the stored charge. These characteristics are very sensitive to changes in the thickness and/or stoichiometry of the oxide film.

In order to surmount these difficulties, researchers have attempted to construct EEPROM cells that do not rely upon charge injection from an induced channel region. In U.S. Pat. No. 4,104,675 (issued Aug. 5, 1978, to DiMaria et al and assigned to the assignee of the present invention), the silicon substrate is covered with a thick layer of thermal silicon oxide and thin layers of pyrolytic silicon oxide. A layer of aluminum is disposed above the pyrolytic $SiO_2$ layers. As shown in FIG. 7 of the patent, the aluminum layer serves as the gate electrode of an FET storage device with the pyrolytic $SiO_2$ layers and the thermal $SiO_2$ layer serving as the gate dielectric. The pyrolytic $SiO_2$ layers have excess silicon incorporated in them. The amount of excess silicon is increased as a function of distance from the thermal $SiO_2$-silicon substrate interface. This increase in silicon concentration produces a graded band gap structure that is conducive to injection of holes and electrons from the aluminum electrode to the $SiO_2$-substrate interface. Thus, rather than relying on surface tunneling, the DiMaria patent shows a structure in which charge injection/removal takes place between a trapping center and an overlying charge injection structure. In practice, it would be difficult to construct a memory cell based upon the teachings of this patent, in that the thick silicon oxide layer is a poor trapping layer. That is, not enough charge would be trapped, and the charge which is trapped would be non-uniformily dispersed within the silicon oxide layer. As such, the effect of a given quantity of the trapped charge upon the threshold of EEPROM cell the device will vary from device to device.

Some of the above-noted shortcomings were recognized by DiMaria in his later work. See for example an article by DiMaria et al, entitled "Electrically-Alterable Read-Only-Memory Using Silicon-Rich $SiO_2$ Injectors and a Floating Polycrystaline Silicon Storage Layer," *Journal of Applied Physics*, Vol. 52, No. 7, July 1981, pp. 4825-4842. As shown in FIG. 2 of this paper, a stoichiometric silicon oxide layer is sandwiched between two silicon-rich silicon oxide layers. The lower silicon-rich silicon oxide layer is disposed on a first polysilicon electrode, and the upper silicon-rich silicon oxide layer is disposed below a second polysilicon electrode. Charge transfer is effected between the two polysilicon electrodes through the two silicon-rich silicon oxide layers. The dual silicon-rich silicon oxide layers, in conjunction with the central stoichiometric silicon oxide layer, is commonly referred to as a dual electron injector structure (or DEIS). Note first that the lower polysilicon electrode serves as a floating gate that stores injected charge. Such a structure will store more charge than the thick oxide layer of the above-described patent, while storing the injected charge in a more uniform manner. Moreover, as opposed to the patent, the amount of silicon in the lower and upper silicon rich silicon oxide layers is relatively similar, and the intervening silicon oxide layer does not have any excess silicon.

However, the above-described memory cell suffers from still another problem. In order to provide a reliable charge storage structure, a conductive layer is used. Thus, similarly to the Kahng '142 patent previously cited, reliance is placed upon the capacitive coupling between the floating gate and the control gate to program and/or erase the cell. This situation is incompatible with current device technologies which rely on lower applied voltages. Moreover, because it is difficult to precisely control the characteristics of the oxide layer between the two polysilicon layers, the capacitive characteristics must be compensated by increasing the size of the lower polysilicon electrode relatively to the upper polysilicon electrode. This is also incompatible with current device scaling trends.

Accordingly, there is a need in the art for an EEPROM storage cell that incorporates a nonconducting charge trapping structure that is not programmed by hot carrier injection and which is compatible with current device scaling trends.

SUMMARY OF THE INVENTION

Thus, it is an object of the invention to provide a non-conductive charge trapping structure.

It is another object of the invention to provide a charge trapping structure that does not rely on hot carrier injection.

It is yet another object of the invention to provide a charge trapping structure that is not overly sensitive to small variations in thickness and/or stoichiometry.

It is a further object of the invention to provide a charge trapping structure that can be utilized in dense EEPROM arrays.

The foregoing and other objects of the invention are realized by a charge trapping structure that is comprised of a layer of silicon-rich silicon nitride. The silicon content of the silicon-rich silicon nitride layer is controlled such that the layer provides appreciable charge storage enhancement, without providing appreciable charge conduction enhancement, as compared to stoichiometric silicon nitride.

In one particular aspect of the invention, a charge trapping injection structure is provided by the above layer of silicon-rich silicon nitride, a barrier layer, and a second layer of silicon-rich silicon nitride that provides appreciable charge conductance enhancement, without providing appreciable charge storage enhancement, as compared to stoichiometric silicon nitride.

In another particular aspect of the invention, the above-described charge trapping/injection structure is provided between the gate dielectric and the control electrode to define the gate electrode of an FET EEPROM cell. The cells are disposed in a series of substrate portions isolated from one another by deep, isolation trenches. The substrate portions can be individually biased by respective substrate bias generators. This allows erasure of individual cells, to provide an overwriteable EEPROM array.

A memory cell incorporating the above structures eliminates the scaling constraints provided by conductive trapping layers, while avoiding hot carrier injection as a charge injection mechanism.

BRIEF DESCRIPTION OF THE DRAWINGS

The foregoing and other structures and teachings of the present invention will become more apparent upon a description of the best mode for carrying out the invention as rendered below. In the description to follow, reference will be made to the accompanying drawing, in which.

DESCRIPTION OF THE BEST MODE FOR CARRYING OUT THE INVENTION

In attempting to provide a non-conductive charge trapping structure, the inventors considered a number of alternatives. Each of these alternatives are discussed below.

Stoichiometric $SiO_2$ has been shown to have charge trapping properties. These charge trapping properties vary greatly as a function of processing. In an article by Gdula, "The Effects of Processing on Hot Electron Trapping $SiO_2$," *J. Electrochem. Soc.*, January 1976, pp. 42–47, boron-doped CVD $SiO_2$ was shown as having a charge trapping efficiency that is three orders of magnitude greater than that of $SiO_2$ thermally grown in a dry $O_2$ ambient. In an article by Young, "Electron Trapping in $SiO_2$," *Inst. Phy. Conf.*, S.N. 50, 1980, pp. 28–39, the trap density was also shown to vary by one order of magnitude as a function of post-deposition anneal time, temperature, and ambient. The optimum trap density for $SiO_2$ has been shown to be on the order of $10^{17}$–$10^{18}$/cm$^3$. This is at least three orders of magnitude less than what is needed to control the channel region of an FET. Moreover, because of the high diffusivity of silicon within $SiO_2$, the actual trap locations vary in distance from the substrate surface. This produces variations in the effect of the stored charge on the threshold voltage of the storage cell.

Silicon-rich $SiO_2$ has been shown to have a greater amount of traps than does stoichiometric $SiO_2$. In an article by DiMaria et al, "Charge Transport and Trapping Phenomena in Off-Stoichiometric Silicon Dioxide Films," *J. Appl. Phy.*, Vol. 54, No. 10, October 1983, pp. 5801–5827, Si-rich $SiO_2$ (1%–6% excess Si) was shown as having approximately $10^{20}$ traps/cm$^3$. In addition to the -OH functional groups and the physical discontinuities that provide the major trap centers in stoichiometric $SiO_2$, silicon-rich $SiO_2$ has clusters of silicon atoms that provide extra traps. However, as pointed out in the DiMaria paper, the presence of the Si clusters presents a new mechanism for electron transport (i.e., Fowler-Norheim tunneling between the cluster-cluster energy bands). This enhances the conductivity of the film to the point where the 1%–6% Si-rich $SiO_2$ films store less charge than do stoichiometric $SiO_2$ films. As the silicon content of the $SiO_2$ film increases, the above conductivity characteristics increase exponentially due to the combined efforts of increased silicon cluster size and decreased inter-cluster distance. It has been shown that a highly Si-rich $SiO_2$ layer (Si=13% above stoichiometric) on top of a stoichiometric $SiO_2$ layer produces an electron current $\simeq 10^5$ greater than that provided by $SiO_2$ alone to the same applied bias. See DiMaria et al, "High Current Injection Into $SiO_2$ From Si-Rich $SiO_2$ Films and Experimental Applications," *J. Appl. Phy.*, Vol. 51, No. 5, May 1980, pp. 2722–2735. As shown in the DEIS EEPROM patents previously cited, this injection characteristic has been used in many EEPROM applications. However, since Si-rich $SiO_2$ functions as a charge injector rather than a charge trap, it cannot be used to provide a charge retention function.

It is known to use silicon nitride as a charge trapping structure. In the metal-silicon nitride-oxide-silicon (MNOS) PROMs, electrons injected from the substrate by avalanche breakdown pass through the oxide layer and are trapped by the silicon nitride layer. However, these devices suffer from several problems. "Charge stored in the $Si_3N_4$ layer will rearrange itself and leak off in time due to the conductivity and bulk trapping properties of the $Si_3N_4$. Trapped charges can also back-tunnel from near the $Si_3N_4$-$SiO_2$ interface to the Si substrate through the thin ($\simeq$25–30 Å) $SiO_2$ layer." DiMaria et al, "Electrically-Alterable Read-Only-Memory Using Si-Rich $SiO_2$ Injectors and a Floating Polycrystalline Silicon Storage Layer," *J. Appl. Phy.*, Vol. 52, No. 7, July 1981, pp. 4825–4842, 4826.

In conducting experiments on silicon-rich $Si_3N_4$, the inventors found that the bulk conductivity characteristics agreed with DiMaria's findings regarding Si-rich $SiO_2$. As the silicon content was increased, the conductivity of the films also increased. The net effect was to decrease trapping at low Si percentages and to substantially eliminate trapping at higher Si percentages. These results were presented at the 166th Meeting of the Electrochemical Society (New Orleans, LA, Oct. 7–12, 1984) in a presentation entitled "Physical and Electrical Characteristics of LPCVD Si-Rich-Nitride Films" by A. Bhattacharyya et al. See also Tanabashi et al, "Properties of Vapor Deposited Silicon Nitride Films with Varying Excess Si Content," *Japan J. Appl. Phy.*, Vol. 12, No. 5, May 1973 pp. 641–647. However, when stressing thin films (100Å) at constant voltage versus the thick films ($\geq 0.1$ $\mu$m) stressed at constant current as discussed in the above references, the inventors found that at small percentages of additional Si in the $Si_3N_4$, the additional trap center density was not offset by enhanced conductance as it is in low percentage Si-rich $SiO_2$. In other words, low percentage Si-rich $Si_3N_4$ films effectively store more charge than does stoichiometric $Si_3N_4$. For higher silicon percentages, the enhanced conductance effect began to increase. Eventually, the observed thin film properties were in agreement with those previously reported for the bulk film.

Figure 1:
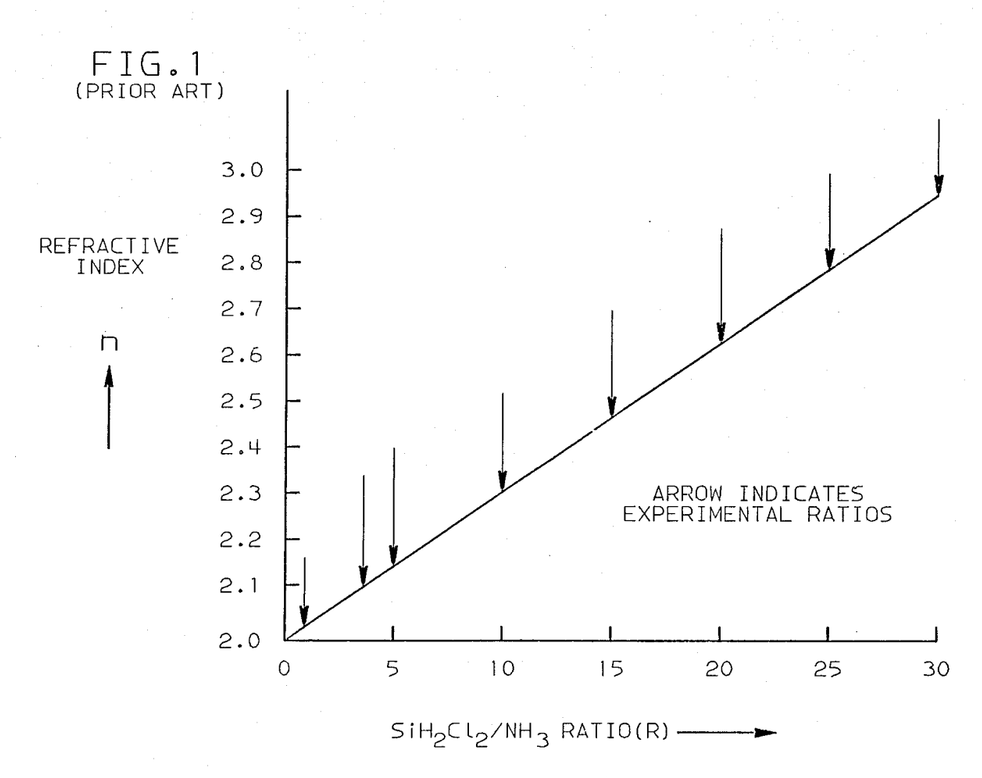
FIG. 1 (Prior Art) is a graph showing refractive index of silicon-rich silicon nitride films versus $SiH_2Cl_2/NH_3$ flow rate ratio.
Figure 2:
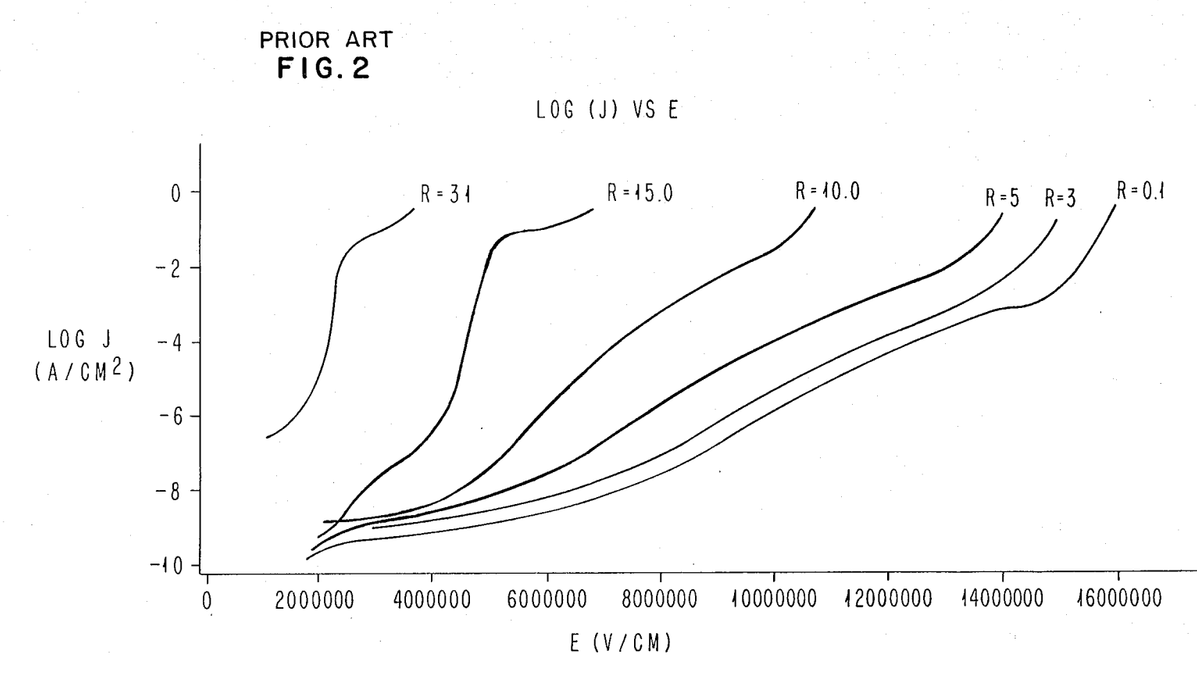
FIG. 2 is a graph showing current density versus applied field for silicon-rich silicon nitride films having different percentages of excess silicon.
Figure 3:
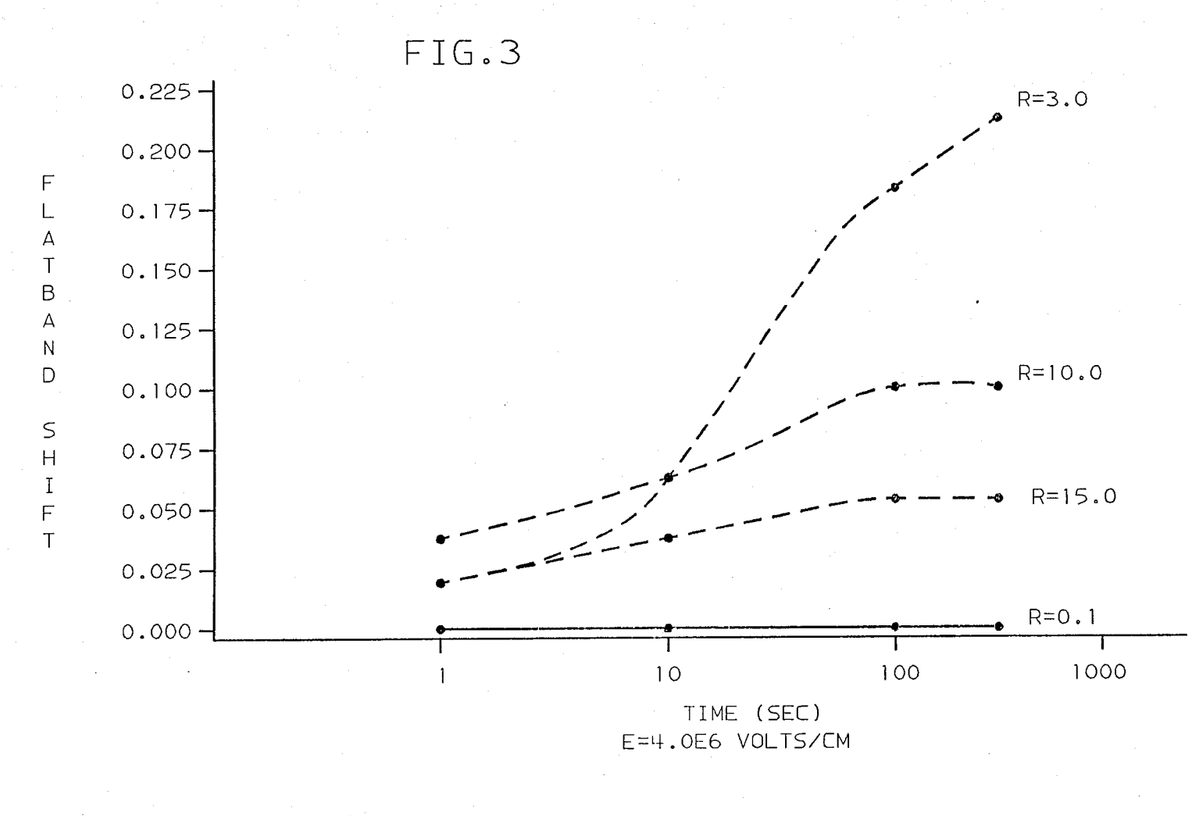
FIG. 3 is a graph showing flat band shift versus time at an applied field of $4 \times 10^6$ volts/cm for silicon-rich silicon nitride films having varying percentages of excess silicon.
Figure 4:
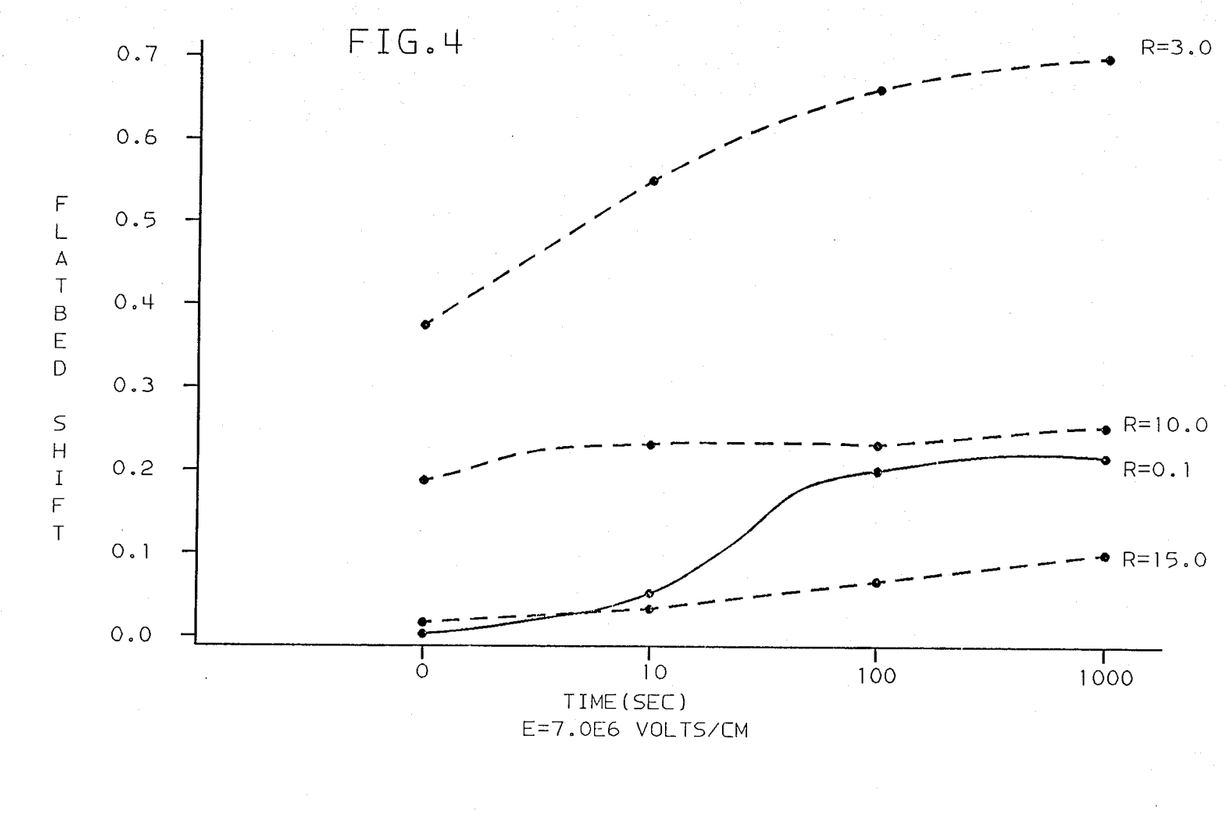
FIG. 4 is a graph showing flat band shift versus time at a applied field of $7 \times 10^6$ volts/cm for silicon-rich silicon nitride films having varying percentages of excess silicon.

The above experimental results are shown in FIGS. 1–3. A capacitor structure from which these results were obtained consisted of a 45 Å $SiO_2$ layer thermally grown on a p-type silicon substrate, a 75 Å $Si_3N_4$ layer deposited by LPCVD (0.25 Torr, 770° C.) using dichlorosilane and ammonia at varying ratios (from R=0.1 for stoichiometric $Si_3N_4$ to R=31 for heavily Si-rich $Si_3N_4$), and a one micron layer of aluminum. FIG. 1 (Prior Art) is a graph of $SiH_2Cl_2/NH_3$ flow rate ratio R versus the index of refraction of the $Si_3N_4$ films as shown at the 1984 ECS presentation. The index of refraction increases linearly with increasing silicon content. FIG. 2 shows a plot of log J (current density in amperes/cm$^2$) versus electric field E (volts/cm) for $Si_3N_4$ layers having an R of 0.1, 3, 5, 10, 15, and 31. In general, the plot show that the $Si_3N_4$ layers having small additions of silicon (R=3 and 5) exhibit a relatively small conductivity increase over stoichiometric $Si_3N_4$. Conductivity enhancement substantially increases with increasing silicon content at or above R=10. FIG. 3 is a plot of flatband shift versus time at an applied electric field of $4 \times 10^6$ v/cm. Notice that for R=3, the flatband shift is greater than the shifts produced by films having an R of 0.1, 10 or 15. Notice also that the film having an R of 10 provides a greater flatband shift than does a film having an R of 15. When the applied field is raised to $7 \times 10^6$ v/cm (FIG. 4), the flatband shift produced by the R=3 film is even greater, while the shifts produced by the R=10 and R=15 films do not appreciably change. The above-described experimental results indicate that at low additional silicon content, silicon-rich $Si_3N_4$ films exhibit appreciably enhanced trapping characteristics (as shown by the high flatband shifts at moderate and high applied electric fields in FIGS. 3 and 4, respectively) without exhibiting appreciably enhanced conductivity characteristics (as shown in FIG. 1). This is the opposite of what was previously reported for low percentage silicon-rich silicon oxide films.

Figure 5:
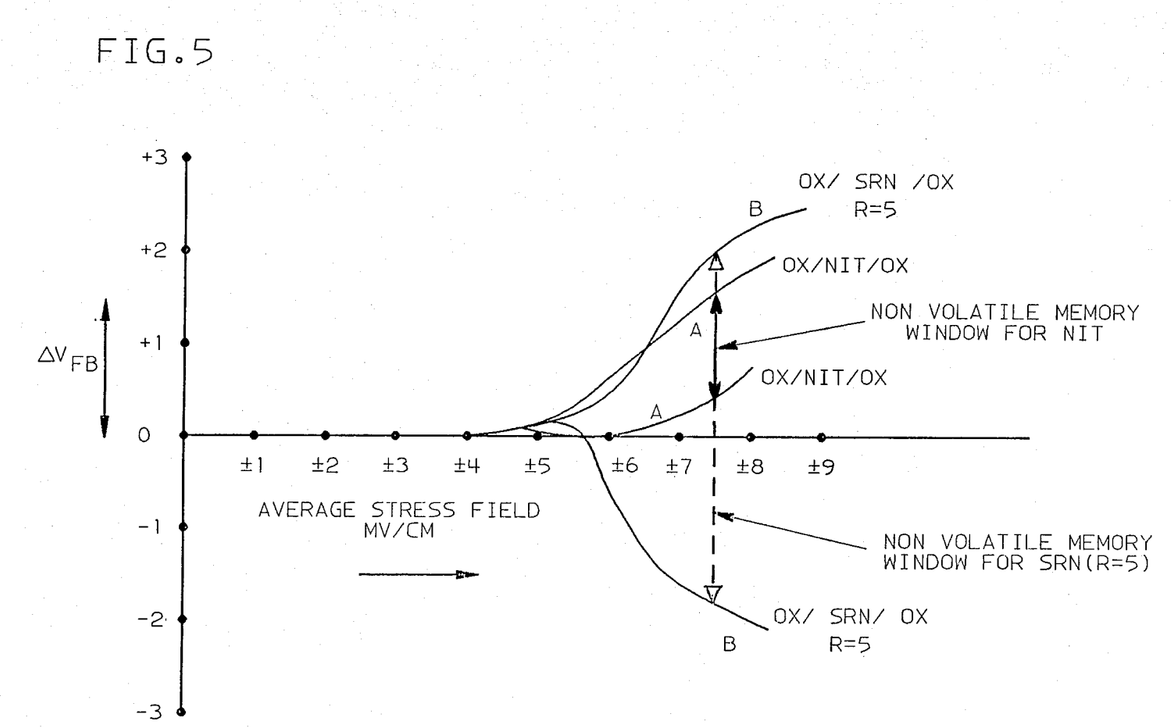
FIG. 5 is a graph showing flat band shift versus applied fields of different polarity for stoichiometric silicon nitride and silicon-rich silicon nitride at $R=5$.

A further experiment was conducted in attempting to characterize the charge trapping properties of silicon-rich $Si_3N_4$. FIG. 5 shows a plot of the flatband shift produced at an applied electric field (in MV/cm) of either polarity when stressed for a fixed time duration at any field strength. The test structure consisted of 70 Å of thermal silicon oxide grown on a p-type silicon substrate, 100 Å of deposited nitride or silicon-rich $Si_3N_4$ (R=0.1 and 5), 45 Å of oxide thermally grown on the $Si_3N_4$ or silicon rich $Si_3N_4$ layer, and a one micron layer of aluminum. Note that the stoichiometric $Si_3N_4$ (solid line) exhibits a positive flatband shift for E-fields of either polarity, and that the difference between the two shifts is only approximately 1.5 volts at $E=\pm 7.5\times 10^6$ v/cm. However, the Si-rich $Si_3N_4$ film of R=5 exhibits positive and negative flatband shifts as a function of E field polarity. Thus, both holes and electrons are being trapped. The difference between the two voltage shifts is approximately 3.5 volts at $E=7.5\times 10^6$ v/cm. This difference in flatband voltage shift is sufficient to provide a manufacturable EEPROM storage cell.

As shown by the experiments discussed above, silicon-rich silicon nitride films deposited at an R of 3 or 5 (for a refractive index of 2.10 and 2.17, respectively) will provide the charge storage function normally provided by a polysilicon floating gate of a EEPROM cell. In general, silicon-rich nitride films having an R greater than 0.1 and less than 10 (or, more specifically, having an index of refraction between approximately 2.10 and 2.30) will provide appreciably enhanced charge trapping without providing appreciably enhanced charge conduction.

Figure 6:
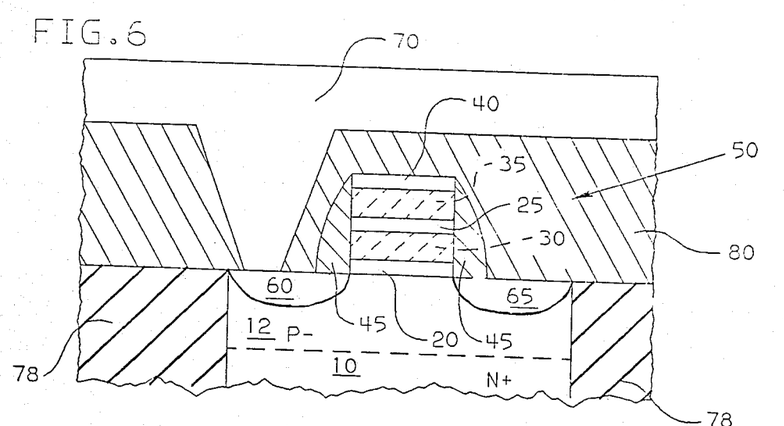
FIG. 6 is a cross-sectional view illustrating a memory cell constructed in accordance with the teachings of the present invention.

FIG. 6 presents a cross-sectional view of a EEPROM cell having the above-described silicon-rich silicon nitride layer as a charge trapping structure. A gate structure 50 is provided on the surface of a silicon substrate 10. The substrate 10 is a <100> oriented, N+ type monocrystalline silicon wafer having a P− surface region 12 formed by epitaxial deposition or by implantation. A 100 Å silicon oxide layer 20 is thermally grown on the substrate 10. In practice, the insulator 20 could also be comprised of a plurality of silicon oxide - silicon nitride or silicon oxide-silicon oxynitride layers. A silicon-rich silicon nitride film 30 deposited at R<10 is provided on top of the silicon oxide layer 20. This layer should be approximately 15 Å to 100 Å in thickness. It is preferred that the silicon-rich silicon nitride film be deposited at an R in the range of equals 3 to 5. Then a 40 to 100 Å barrier layer 25 is formed on the silicon-rich silicon nitride film 30. It is preferable that this barrier layer be formed by thermal growth of an oxide layer on the silicon-rich silicon nitride layer, by exposure to a wet $O_2$ ambient held at high temperatures.

In providing the EEPROM cell of the invention, the inventors wanted to maximize the charge stored at a given bias. Due to the sensitivities resulting from dense device geometries, the inventors wanted to utilize control voltages in the 10–12 volt range or less. As is known in the art, one method of increasing the amount of charge trapped by a charge trapping structure (while also eliminating tunnelling from the substrate as the charge injection mechanism) is to form a charge injecting structure above the charge trapping structure.

Accordingly, a charge injection structure 35 is deposited on the barrier layer 25. In general, silicon oxide electron injector structures (consisting of a silicon-rich $SiO_2$ layer atop a stoichiometric $SiO_2$ layer) provide good charge injecting properties, and as such they can be utilized to provide a charge injection in the invention. However, in the present invention it is preferred to form the charge injector structure from a layer of silicon-rich silicon nitride (R>10) atop an insulator such as stoichiometric $SiO_2$. Silicon nitride injectors are preferred over silicon oxide injectors for the following reasons. The interface between the silicon-rich $SiO_2$ film and the stoichiometric $SiO_2$ film provides enhanced injection. "The high current is believed to be caused by a localized electric field distortion at the Si-rich-$SiO_2$ - $SiO_2$ interface due to the two-phase (Si and $SiO_2$) nature of this material..". DiMaria et al, "Charge Trapping Studies In $SiO_2$ Using High Current Injection From Si-Rich $SiO_2$ Films," *J. Appl. Phy.*, Vol. 51, No. 9, September 1980, pp. 4830–4841. Studies have shown that silicon readily diffuses within silicon oxide. As shown in Tables II and III of an article by Nesbit entitled "Annealing Characteristics of Si-Rich $SiO_2$ Films," *Appl. Phy. Lett.*, Vol. 46, No. 1, January 1985, pp. 38–40, both the size of the silicon clusters in Si-rich $SiO_2$ and their diffusivity increases with increasing anneal time/temperature. Since high anneal time/temperatures are used in most post-gate electrode process sequences the silicon clusters that provide the enhanced silicon oxide injection characteristics will diffuse into the adjoining $SiO_2$, disrupting the injection threshold by reducing the localized field distortions. Since silicon has a much smaller degree of diffusivity within $Si_3N_4$, the $Si_3N_4$/$SiO_2$ interface will be much more resistant to subsequent hot process steps. The resulting Si-rich $Si_3N_4$ injector (index of refraction equal to or greater than approximately 2.35, preferably 2.50 for an R of 15) will provide appreciably enhanced charge conductance (FIG. 2) without providing appreciably enhanced charge trapping (FIGS. 3 and 4) over stoichiometric $Si_3N_4$.

The conductive material defines a control electrode 40 in the form of an elongated line that interconnects a plurality of the gates. In this sense, the control electrode 40 is similar to the word lines commonly used to interconnect the transfer gate FETs of one-device dynamic random access memory cells. While the control electrode 40 can be made from a host of conductive materials (e.g., aluminum, aluminum alloys, refractory metals, refractory metal silicides, it is preferred that it be formed from doped polysilicon or a composite of a doped polysilicon and a refractory metal silicide such as tungsten silicide or titanium silicide.

After the control electrode 40 is formed, a 500 to 2000 Å layer of silicon oxide is deposited on the substrate, and is directionally etched in a $CF_4/O_2$ plasma to provide spacers 45 disposed on the sidewalls of the composite gate stack 50. To the extent that dielectric layer 20 was not patterned during the definition of the gate stack 50, remaining portions will be removed during definition of the spacers 45. N+ type diffusion regions 60, 65 are then defined by phosphorous ion implantation on either side of the composite gate electrode, and a passivation layer 80 (made up of a high dielectric reflowable material such as phosphosilicate glass, borophosphosilicate glass, or organic resins such as polyimide)

is deposited on the wafer. A conventional photoresist is then deposited, exposed, and developed to expose portions of the passivation layer 80 lying above the diffusion regions 60, 65, and these portions are removed by etching in a $CHF_3/O_2$ RIE to define vias. A metal layer is then deposited and patterned to fill the vias and to thus establish contact to the diffusion regions. Finally, the metal layer is patterned so that selected ones of the diffusion regions are interconnected, as described in more detail below.

Figure 7:
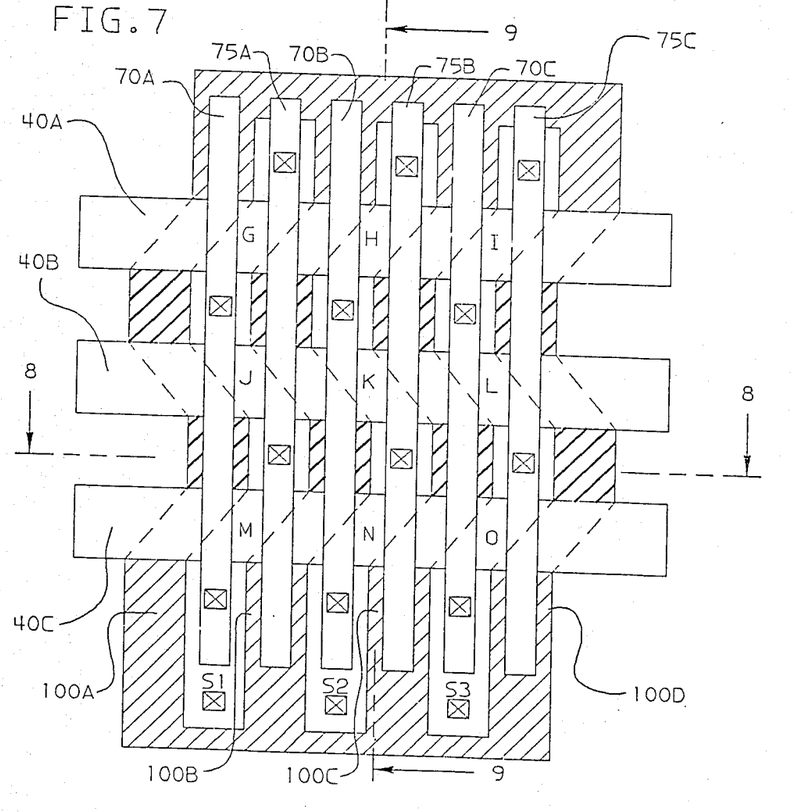
FIG. 7 is a top view of an array of the memory cells shown in FIG. 6.

FIG. 7 is a top view of an array of memory cells constructed in accordance with the present invention. A plurality of isolation regions 100A-100D are disposed in a serpentine fashion parallel to one another, so as to define isolated substrate portions. These isolation regions 100 will be described in more detail below. The wordlines 40A-40C are disposed in a direction orthogonal to the isolation regions 100A-100D. The portions of the wordlines 40A-40C that provide the control electrodes 40 atop the gate stacks 50 are designated by the reference letters G-O. Thus, for example, wordline 40A provides the control electrode 40 for a first gate stack G, a second gate stack H, and a third gate stack I. The metal lines 70A-70C and 75A-75C are disposed in an alternating manner in a direction parallel to that of the isolation regions 100A-100D. The metal lines interconnect alternating ones of the diffusion regions on each side of the wordlines. More specifically, referring back to FIG. 6, the metal lines 70A-70C are connected through the vias in the passivation layer 80 to the diffusion region 60. Metal lines 70A-70C will be biased such that the diffusion regions 60 act as the FET source electrodes. Thus, lines 70A-70C will be referred to as "source lines." Similarly, metal lines 75A-5C are coupled to the diffusion regions 65. Since the diffusion regions 65 will act as the FET drain electrodes, lines 75A-75C will be referred to as "drain lines." The contacts between the metal lines and the diffusion regions are depicted in FIG. 7 by the cross hatched boxes. Thus, adjacent memory cells disposed between the same isolation regions 100A-100D share a common diffusion region. For example, the memory cell defined by the gate stack G and the memory cell defined by the gate stack J share a common source diffusion region 60 coupled to the source line 70A. Similarly, the memory cell defined by gate stack J and the memory cell defined by gate stack M share a common drain diffusion region 65 coupled to drain line 75A.

Figure 8:
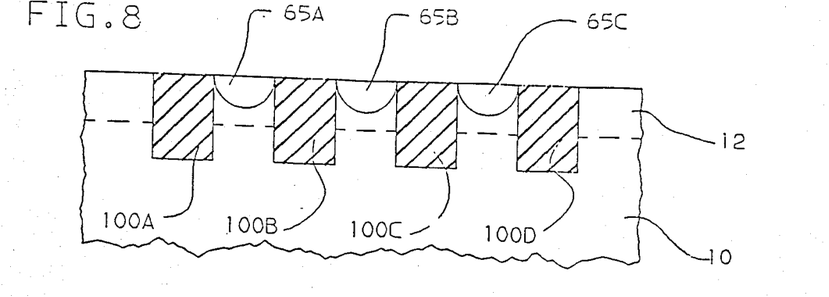
FIG. 8 is a cross-sectional view taken along lines 8—8 of FIG. 7.

FIG. 8 presents a cross-sectional view taken along lines 8—8 of FIG. 7. As shown in FIG. 8, adjacent silicon portions (having e.g., diffusion regions 65A formed therein) are laterally separated by the isolation regions 100. The isolation regions 100 can be formed by etching portions of the silicon substrate exposed by a conventional photoresist atop a non-erodible mask (e.g., a layer of silicon oxide on the substrate and a layer of silicon nitride on the silicon oxide). The exposed substrate portions may be anisotropically etched in a chlorine-based gaseous plasma. A thick layer of silicon oxide may then be deposited on the sidewalls and bottom of the trenches, and the trenches may be filled with polysilicon. Portions of the polysilicon and thick silicon oxide that lie outside the trenches are then removed. Alternatively, the trenches can be filled with a thick layer of silicon oxide or other insulative material (e.g., polyimide). Either way, the trenches must be deep enough to extend through the P— type surface region 12 into the N+type bulk substrate 10. In this manner, the isolation regions separate the substrate into discreet portions that can be independently biased. Thus, referring back to FIG. 7, the substrate portion upon which memory cells G, J and M are formed can be set at a first potential, while the remaining substrate portions are set at a second potential. In practice, any one of a number of known substrate bias circuits could be used to independently set the bias on the respective substrate portions. The outputs of these circuits are fed through contacts S1, S2, etc., to the individual substrate portions. The contacts are surrounded by the trenches so that adjacent portions of the substrate are not affected. The significance of this capability will be discussed in more detail below.

Figure 9:
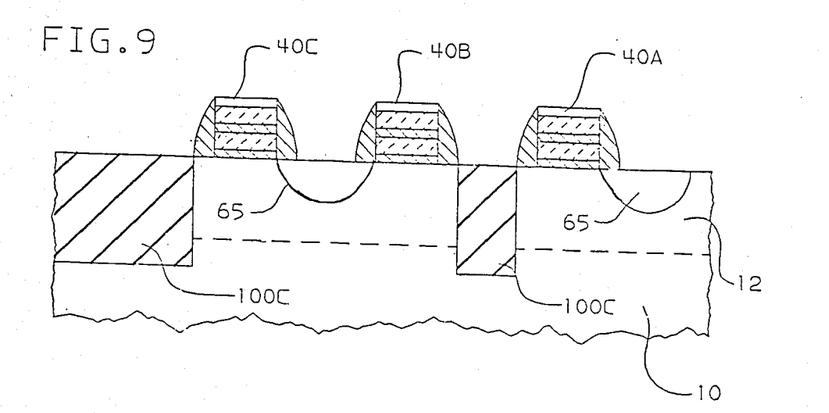
FIG. 9 is a cross-sectional view taken along lines 9—9 of FIG. 7.

FIG. 9 is a cross-sectional view taken along lines 9—9 of FIG. 7. Note again that adjacent memory cells share a common diffusion region.

The operation of the array of memory cells as shown in FIGS. 7-9 will now be described.

To read data from one of the cells, the wordline 40A-40C associated with the desired cell is raised from 0 volts to +5 volts, and all of the drain lines 75A-75C are also raised from 0 volts to +5 volts. The source lines 70A-70C are held at 0 volts. The drain line voltage is monitored by any one of the known differential latch sense amplifier circuits utilized in one-device dynamic random access memory technology. If the silicon-rich silicon nitride layer 30 of the gate stack 50 of the accessed cell is storing charge, the channel region associated with that device will not be able to invert such that the device will not turn on and the drain line voltage will not change. The presence of stored charge indicates a "low" logic state. If the silicon-rich silicon nitride layer 30 of the gate stack 50 of the accessed cell is not storing charge, the high voltage on the control electrode 40 will cause the device to turn on, such that the coupled drain line 75A-75C loses a small amount of charge that is detected by the sense amp. The lack of stored charge indicates a "high" logic state.

To write a "high" logic state into one of the cells, the wordline 40A-C associated with the desired cell is raised from 0 volts to +10 volts. All of the drain lines 75A-75C and source lines 70A-70C are raised to a potential of +5 volts except for the source line - drain line pair associated with the desired cell, which is kept at 0 volts. As a consequence, the gate stack 50 of the desired cell has a potential of +10 volts across it, which produces an electric field from the control electrode 40 to the substrate 12 that is sufficient to cause charge injection from the silicon-rich silicon nitride layer 30 through the charge injecting structure 35 to the control electrode 40. These control voltages are maintained long enough to allow complete depopulation of the charge traps in the Si-rich silicon nitride charge storage layer 30. A feature of the applied control voltages is that the maximum differential potential applied to an unselected cell is +5 volts, which is insufficient to cause detrapping of stored charge.

To write a "low" logic state into one of the cells, the wordline 40A-40C associated with the desired cell is held at 0 volts, and the other wordlines are held at +5 volts. The unselected source lines 70A-70C and drain lines 75A-75C are raised to +5 volts, while the lines associated with the selected cell are allowed to float (i.e., they are not coupled to a source of potential). At the same time, the substrate portion within which the desired memory cell is formed is pumped up to +10 volts. The remaining substrate portions are retained at ground potential. Consequently, an electric field is provided from the substrate to the control electrode 40, such that charge will be injected from the control electrode through the charge injection structure, into the silicon-rich silicon nitride layer 30. Again, the applied control voltages supply a differential voltage of +5 volts to unselected cells, thus preventing undesired programming.

Thus, as shown above, an individual cell may be overwritten with successive opposing logic states without erasing an entire line or array of cells.

The above operations will now be illustrated by the following Examples, illustrating sequential operational cycles carried out on one of the memory cells in the array shown in FIG. 7.

EXAMPLE 1

Write "0" Into Cell K

Wordline 40B remains at 0V, while wordlines 40A and 40C are raised to +5V. Lines 70A, 75A and 70C, 75C are raised to +5V, while lines 70B, 75B are allowed to float. The substrate portion between isolation regions 100B and 100C is pumped up to +10V, while the remaining substrate portions are kept at 0V. Thus the gate stack K has −10V across it, and electrons will be injected from the control electrode 40 into and trapped by the silicon-rich $Si_3N_4$ layer 30 of the gate stack 50 of cell K.

EXAMPLE 2

Write "1" Into Cell K

Wordline 40B is raised to +10V, while wordlines 40A and 40C remain at 0 V. Lines 70A, 75A and 70C, 75C are raised to +5V, while lines 70B, 75B remain at 0V. The substrate is at ground potential. Thus the gate stack has +10V across it, and the charge trapped in Example 1 will be removed from the trapping layer 30 and injected into the control electrode 40 of the gate stack 50 of cell K.

EXAMPLE 3

Read Cell K

Wordline 40B is raised to +5V, while wordlines 40A, 40C remain at ground. The drain lines 75A–C are raised to +5V, and the source lines 70A–C remain at ground. Since the cell K is not storing any charge, the device will turn on and the sense amp will detect the slight fall in the drain line voltage.

The above-described memory cell array present a host of advantages. By eliminating polysilicon as the charge trapping structure of an injector type EEPROM, the memory cell of the invention can be scaled without concern for preserving capacitive ratios. By utilizing silicon-rich silicon nitride as the injector material, the manufacturable problems associated with silicon-rich $SiO_2$ may be greatly reduced. Finally, the use of trenchisolated substrate regions provides an overwriteable EEPROM cell that does not rely on high control voltages or large cell structures.

Figure 10:
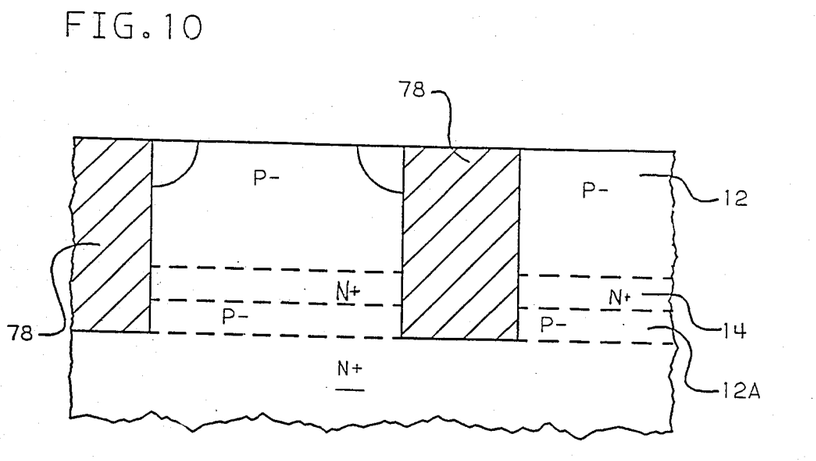
FIG. 10 is a cross-sectional view of one method of providing isolated substrate portions so as to practice the invention.
Figure 11:
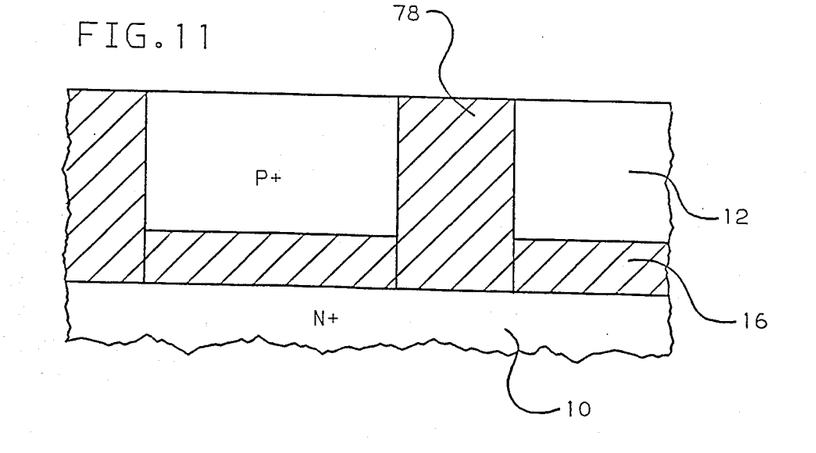
FIG. 11 is a cross-sectional view of another method of providing isolated substrate portions so as to practice the invention.
Figure 12:
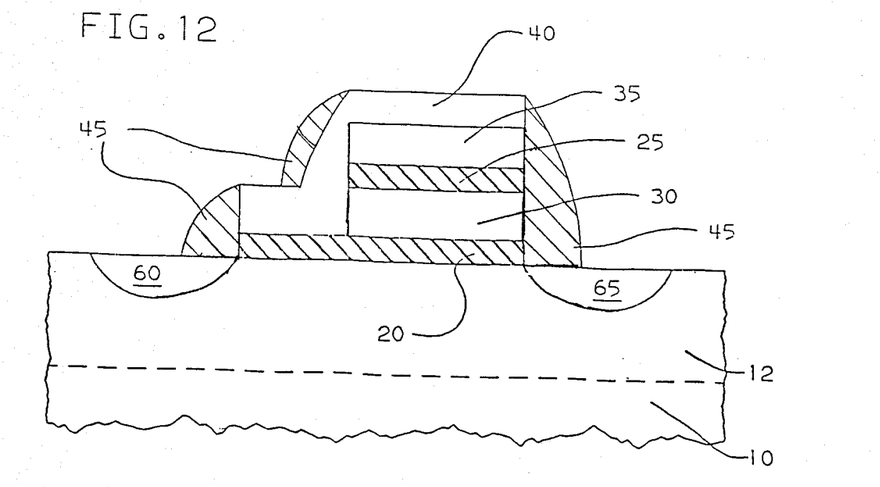
FIG. 12 is a cross-sectional view illustrating another embodiment of the gate stack of the memory cell of the present invention.

While the memory cell of the invention is shown in FIGS. 6–9 as being formed on an n+ substrate 10 having a p− epitaxial layer 12 thereon, in practice this would result in a larger capacitance for write "low" than a write "high." In Example 1, when the local substrate is biased to +10V, the diode at the bottom of the structure (p−n+) is forward biased allowing the n+p− capacitance of adjacent pockets to be seen. This difference in capacitance could be eliminated by several techniques resulting in improved write "low" performance and associated power saving if desired. One such technique would be a deep implanted n+ subcollector layer 14 as shown in FIG. 10. In addition a p+ implant above the n+ subcollector could be added if a lower substrate resistivity is desired. Such a p+ implant, while not required, may also be beneficial from a device design perspective. Another technique, as shown in FIG. 11, consists of an isolation structure 16 below the silicon region 12.

In practice, this structure could be provided by utilizing any one of a number of known silicon-on-insulator processes, e.g., see U.S. Pat. No. 4,601,779.

While the memory cell and array have been described with reference to a particular embodiment, many modifications may be made. For example, if higher control voltages can be tolerated, the charge injector structure can be deleted from the gate stack. Moreover, if there is a concern that programming of unselected cells may occur during writing a "1" state into the desired cell, the structure shown in FIG. 12 can be used. Note that the charge storage - injection layers are disposed over one half the channel length. The remainder of the channel is covered by a conventional polysilicon-dielectric gate structure. Thus, even if an excessive amount of charge is removed, the resulting inversion region would only extend halfway into the channel region. The oxide spacers 45 would be formed after depositing and patterning 25, 30, and 35, and layer 40. Although the invention has been described with reference to control voltages in the 10–12 volt range, these control voltages may be reduced as the cell is further reduced in size consistent with device scaling. Finally, while FIGS. 6–12 show the invention with reference to an EEPROM cell, the teachings of the invention could be applied to nonvolatile DRAM cells, etc.

We claim:

1. A charge storage means for a memory cell comprising a layer of silicon-rich silicon nitride having an index of refraction between approximately 2.10 and 2.35, and a thickness of less than 90 nm, so that said layer of silicon-rich silicon nitride provides appreciable charge storage enhancement, without providing appreciable charge conductance enhancement, as compared to stoichimetric silicon nitride.

2. The memory cell as recited in claim 1, wherein said layer of silicon-rich silicon nitride is chemical vapor deposited from a silane-based source and an ammonia source, so that silane and ammonia are introduced at a flow rate ratio of between approximately 3:1 and 10:1, respectively.

3. An memory cell comprising a field effect transistor having source, gate, and drain electrodes, said gate electrode including a gate stack comprising:
   a dielectric structure deposited on the substrate between said source and drain electrodes;
   a first layer of silicon-rich silicon nitride disposed on said dielectric structure, said first layer of silicon-rich silicon nitride having an index of refraction of less than 2.35;
   a barrier structure disposed on said first layer of silicon-rich silicon nitride;
   a second layer of silicon-rich silicon nitride disposed on said barrier structure, said second layer of silicon-rich silicon nitride having an index of refraction of at least 2.35; and a control electrode disposed on said second silicon-rich silicon nitride layer.

4. The memory cell as recited in claim 3, wherein said dielectric structure is comprised of a material selected from the group consisting of silicon oxide, silicon nitride, silicon oxynitride, and combinations thereof.

5. The memory cell as recited in claim 3, wherein said barrier structure comprises a layer of thermally grown silicon oxide.

6. The memory cell as recited in claim 3, wherein said control electrode is comprised of a material selected from the group consisting of doped polysilicon, aluminum, aluminum alloys, refractory metals, refractory metal silicides, and combinations thereof.

7. A memory cell formed on a semiconductor substrate, comprising:
a gate stack, comprising
a first dielectric structure formed on a first portion of the substrate,
a first silicon-rich silicon nitride layer having an index of refraction of less than 2.35 disposed on said first dielectric structure, said first silicon-rich silicon nitride layer having sufficient excess silicon to provide appreciable charge storage enhancement, without providing appreciable charge conductance enhancement, as compared to stoichiometric silicon nitride,
a second dielectric structure disposed on said first silicon-rich silicon nitride layer,
a second layer of silicon-rich silicon nitride disposed on said second dielectric structure, said second silicon-rich silicon nitride layer having an index of refraction of at least 2.35, said second silicon-rich silicon nitride layer having sufficient excess silicon to provide appreciable charge injection enhancement as compared to stoichiometric silicon nitride;
a control electrode disposed on said second layer of silicon-rich silicon nitride;
first and second diffusion regions formed in portions of said substrate abutting said first portion of the substrate;
first means for biasing said first diffusion region; and
second means independent of said first means for biasing said second diffusion region.

8. The memory cell as recited in claim 7, wherein said first dielectric structure comprises thermally grown silicon oxide.

9. The memory cell as recited in claim 7, wherein said second dielectric structure comprises thermally grown silicon oxide.

10. The memory cell as recited in claim 7, wherein said control electrode is comprised of doped polysilicon.

11. The memory cell as recited in claim 7, wherein said first means comprises a first metal line that contacts said first diffusion region through a first via formed in a passivation layer coated on the substrate, and wherein said second means comprises a second metal line that contacts said second diffusion region through a second via formed in a passivation layer coated on the substrate.

12. An array of memory cells formed on a semiconductor substrate, comprising:
isolation means formed in the substrate for defining discrete portions of the substrate that are isolated from remaining portions of the substrate;
a plurality of cells being formed in each of said isolated discrete portions of the substrate, each of said cells comprising an FET having source and drain diffusions formed in the substrate and a gate electrode formed on a portion of the substrate between said source and drain diffusions,
said gate electrode comprising a dielectric structure formed on the substrate, a first layer of silicon-rich silicon nitride having an index of refraction between approximately 2.10 and 2.30, said first layer of silicon-rich silicon nitride having sufficient excess silicon to provide appreciable charge storage enhancement, without providing appreciable charge conductance enhancement, as compared to stoichiometric silicon nitride, a barrier structure, and a control electrode;
first means for biasing said source diffusions;
second means for biasing said drain diffusions; and
third means for biasing each of said isolated discrete portions of said substrate separately from others of said isolated discrete portions of said substrate.

13. The array as recited in claim 12, wherein said isolation means comprises a plurality of spaced trenches that are filled with one or more isolation materials.

14. The array as recited in claim 13, wherein each of said trenches have sidewalls and a bottom that are coated with a dielectric material.

15. The array as recited in claim 14, wherein said dielectric material comprises silicon oxide.

16. The array as recited in claim 14, wherein said trenches are filled with a semiconductive material.

17. The array as recited in claim 16, wherein said semiconductive material comprises polysilicon.

18. The array as recited in claim 14, wherein said dielectric material fills said trenches.

19. The array as recited in claim 12, wherein said gate electrode further comprises a charge injection means disposed between said barrier structure and said control electrode.

20. The array as recited in claim 19, wherein said charge injection means comprises a second layer of silicon-rich silicon nitride having an index of refraction of at least 2.35, said second layer of silicon-rich silicon nitride having sufficient excess silicon to provide appreciable charge conductance enhancement as compared to stoichiometric silicon nitride.

21. The array as recited in claim 20, wherein said first layer of silicon-rich silicon nitride, said barrier structure, and said second layer of silicon-rich silicon nitride are formed on only a first portion of said dielectric structure, and wherein said control electrode is formed over both said second layer of silicon-rich silicon nitride and remaining portions of said dielectric structure.

22. The array as recited in claim 20, wherein said first layer of silicon nitride has an index of refraction between approximately 2.10 and 2.17, and wherein said second layer of silicon nitride has an index of refraction of approximately 2.50.

23. The array as recited in claim 12, wherein said first means for biasing comprises a first series of conductive lines coupled to a first series of voltages sources, respectively, each one of said first conductive lines being coupled to respective source diffusions of said cells formed in a respective one of said isolated discrete portions of said substrate.

24. The array as recited in claim 23, wherein said second means for biasing comprises a second series of conductive lines coupled to a second series of voltage sources, respectively, each one of said second conductive lines being coupled to respective drain diffusions of said cells formed in a respective one of said isolated discrete portions of said substrate.

* * * * *